(12) United States Patent
Shiraishi et al.

(10) Patent No.: US 6,199,026 B1
(45) Date of Patent: Mar. 6, 2001

(54) METHOD OF AND APPARATUS FOR SIMULATING ROLLING TIRE

(75) Inventors: Masaki Shiraishi, Kobe; Akio Miyori, Akashi, both of (JP)

(73) Assignee: Sumitomo Rubber Industries, Ltd., Kobe (JP)

( * ) Notice: Subject to any disclaimer, the term of this patent is extended or adjusted under 35 U.S.C. 154(b) by 0 days.

(21) Appl. No.: 09/198,509

(22) Filed: Nov. 24, 1998

(30) Foreign Application Priority Data

Nov. 25, 1997 (JP) .................................................. 9-322540
Jan. 19, 1998 (JP) ................................................. 10-007611
Jan. 19, 1998 (JP) ................................................. 10-007612

(51) Int. Cl.[7] ..................................................... G01L 25/00
(52) U.S. Cl. .............................................. 702/140; 703/1
(58) Field of Search .......................... 702/140, 82; 703/6, 703/8, 1, 3, 12, 7; 152/548, 450, 454; 73/146; 157/13; 701/27

(56) References Cited

U.S. PATENT DOCUMENTS 5,396,438 * 3/1995 Oblizajek ............................. 364/552
5,559,729 * 9/1996 Abe ...................................... 364/578
5,710,718 * 1/1998 Kamewaga et al. ................. 364/512

* cited by examiner

*Primary Examiner*—Marc S. Hoff
*Assistant Examiner*—Edward Raymond
(74) *Attorney, Agent, or Firm*—Birch, Stewart, Kolasch & Birch, LLP

(57) ABSTRACT

A method of simulating a rolling tire and a simulator are disclosed, the simulating method comprises the steps of: dividing the tire into a tire body and a tread part therearound, wherein the tire body is defined as a toroidal part of the tire which is materially and geometrically the same or constant along the tire circumferential direction, and the tread part is defined as the remaining annular part around the tire body; modeling the tire body in finite elements; modeling the tread part in finite elements; combining the tread model with the body model to form a tire model; adjusting the beads of the tire model to a wheel rim on which the tire is mounted; contacting the tire model with a road model; moving the road model at predetermined time intervals relatively to the tire model, giving running conditions; obtaining information about the tire model as numerical data in time sequence; and processing the numerical data in time sequence to be outputted as a visible information. Preferably, the body model comprises models of the bead cores, rubber parts, and cord reinforcements each comprising a model of a cord ply and a model of topping rubber, wherein the cord ply is modeled in quadrilateral membrane elements defined as an orthotropic material, and the topping rubber is modeled in hexahedral solid elements.

12 Claims, 19 Drawing Sheets

(A)

METHOD OF AND APPARATUS FOR SIMULATING ROLLING TIRE

BACKGROUND OF THE INVENTION

The present invention relates to a method of and apparatus for simulating rolling pneumatic tires which is capable of analyzing dynamic tire characteristics, e.g. cornering characteristics, vibration damping characteristics, wear characteristics and the like.

Pneumatic tires have made remarkable progress in recent years. Hitherto, such progress has been attained by patient works, repeating trial production, running tests, investigations and improvements. Thus, it is difficult to decrease the development cost and time.

On the other hand, recently, a finite element method becomes used to assist tire designers in analyzing static tire characteristics, e.g. load-deflection, with using a simplified tire model in which the tread pattern is ignored, or regarded as a plane, and reinforcing cord layers such as carcass and belt are regarded as a simple single shell element. Thus, there are limits to such static simulation and simplified tire model when utilizing in actual development of tires.

It is therefore an object of the present invention is to provide a method of and an apparatus of simulating a rolling tire by which accurate analysis dynamic characteristics and exact estimation of tire performances are made possible.

SUMMARY OF THE INVENTION

According to one aspect of the present invention, a method of simulating a pneumatic tire rolling on a road, comprises the steps of:

dividing the tire into a tire body and a tread part therearound, wherein the tire body is defined as a toroidal part of the tire which is materially and geometrically the same or constant along the tire circumferential direction, and comprises bead cores, rubber parts including sidewall rubbers and bead rubbers, and cord reinforcements including a carcass and a belt, and the tread part is defined as the remaining annular part around the tire body which comprises at least a radially outmost part of a tread rubber;

modeling the tire body in finite elements to make a body model;

modeling the tread part in finite elements to make a tread model;

making a finite-element model of the tire by combining the tread model with the body model;

modeling the surface of the road in finite elements to make a road model;

adjusting the beads of the tire model to a wheel rim on which the tire is mounted;

contacting the tire model with the road model;

moving the road model at predetermined time intervals relatively to the tire model, giving running conditions including a moving speed, a slip angle, a tire load and a tire inflation pressure;

obtaining information about the tire model at the above-mentioned predetermined intervals as numerical data in time sequence; and processing the numerical data in time sequence to be outputted as a visible information.

Preferably, the body model comprises models of the bead cores, models of the rubber parts, and models of the cord reinforcements each comprising a model of a cord ply and a model of topping rubber, wherein the cord ply is modeled in quadrilateral membrane elements defined as an orthotropic material, and the topping rubber is modeled in hexahedral solid elements.

BRIEF DESCRIPTION OF THE DRAWINGS

Embodiments of the present invention will now be described in detail in conjunction with the drawings, in which.

DESCRIPTION OF THE PREFERRED EMBODIMENTS

Figure 1:
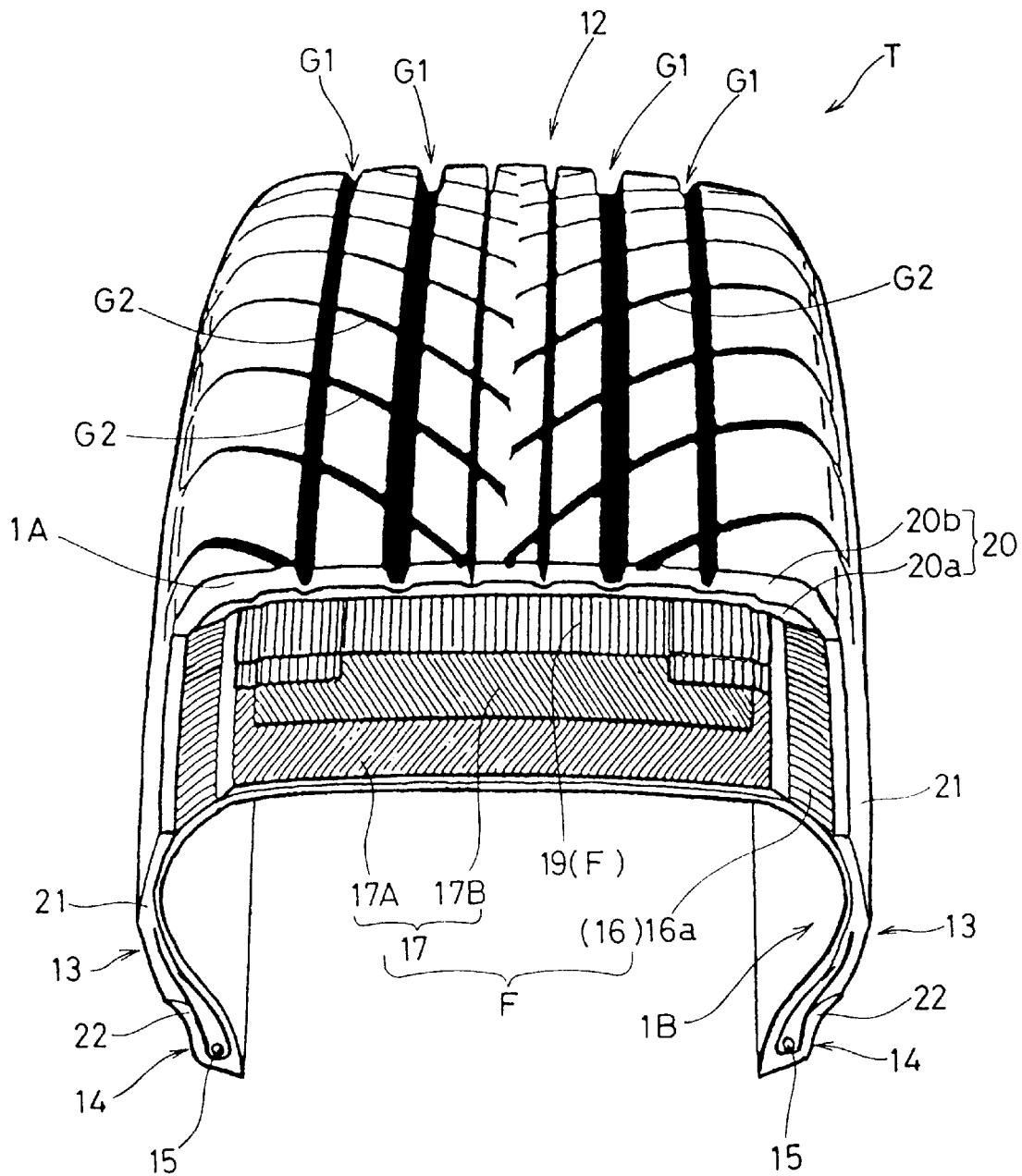
FIG. 1 is a perspective view of a pneumatic tire showing a typical tire structure.

Referring to FIG. 1 in which a radial tire for passenger cars is shown as a typical example of pneumatic tires, a tire structure is first described.

Typical Tire Structure

A tire T comprises a tread 12, a pair of sidewalls 13 and a pair of axially spaced beads 14 to have a toroidal shape. The tire T is provided with a carcass 16 as the main frame, which extends from one of the beads 14 to the other through the tread 12 and sidewalls 13. The tread 12 is reinforced with a belt 17, 19 disposed on the radially outside of the carcass 16. Further, each bead 14 is provided with a bead core 15 disposed therein to be secured on the wheel rim, and optionally a reinforcing cord layer disposed along the carcass 16. The carcass 16, belt 17, 19 and optional reinforcing cord layer collectively form a reinforcing-cord structure (hereinafter cord-reinforcement F). On both sides of the cord-reinforcement F, there are disposed many kinds of rubber strips: a tread rubber 20 and sidewall rubber 21 on the outside, a bead rubber 22 extending from the outside to the inside, and an inner liner rubber on the inside. Further, between the carcass turnup and main portion, a hard bead apex rubber is disposed. On the tread rubber 20, tread grooves G1, G2 are formed to define a tread pattern.

In the example shown in FIG. 1, the carcass 16 is composed of a single ply 16a of organic (polyester) fiber cords arranged radially at substantially 90 degrees with respect to the tire circumferential direction and turned up around the bead cores 15. The belt is composed of a breaker 17 disposed on the radially outside of the carcass 16 and a band 19 disposed on the radially outside of the breaker 17. The breaker 17 is composed of two cross plies 17A and 17B of parallel steel cords laid at 20 degrees with respect to the circumferential direction. The band 19 is composed of a pair of axially spaced edge plies and a cut-end full-width ply disposed thereon, each made of nylon cords laid substantially parallel to the circumferential direction. The tread rubber 20 has a double-layered structure comprising an under-tread rubber 20a between the belt and a tread groove bottom line and a cap rubber 20b disposed thereon. The sidewall rubber 21 is smaller in the complex elastic modulus than the tread rubber 20. The bead rubber 22 has a relatively higher elastic modulus than others. The tread 12 is provided with circumferential grooves G1 and axial groove G2 to form a bi-directional tread pattern.

Summary of Simulations

In this invention, various dynamic simulations are made based on a finite element method.

The tire is first modeled by finite elements, giving various boundary conditions, e.g. shapes of elements, material characteristics and the like, and kinetic equations are solved by means of a computer.

To solve the kinetic equations, known computational algorithm may be used. In this example, an explicit method (YOUKAIHO) is used. For example, mass matrix M, stiffness matrix K, damping matrix C of the elements are first defined by the elements' shapes and material characteristics, e.g. density, Young's modulus, damping factor and the like.

These matrixes are combined to define the matrix of the entire system to be simulated, and further, applying boundary conditions, the following kinetic equation (Eq.1) is defined.

$$F = M\ddot{x} + C\dot{x} + Kx$$

wherein

F=external force matrix

M=mass matrix $\ddot{x}$=acceleration matrix

C=damping matrix $\dot{x}$=velocity matrix

K=stiffness matrix x=displacement matrix

To make various dynamic simulations, this equation is computed to find the solutions at predetermined short time intervals (t). Preferably, the time intervals (t) is set to being not more than 0.9 times the minimum of the transfer time of stress wave computed on every elements.

Modeling

The subject tire T is modeled by different types of elements (2a, 2b, 2c - - - ) suitable for each individual part or member. For example, three-dimensional (3-D) elements, e.g. tetrahedral element, pentahedral element and hexahedral element and two-dimensional (2-D) elements, e.g. a quadrilateral element are used.

Figure 2:
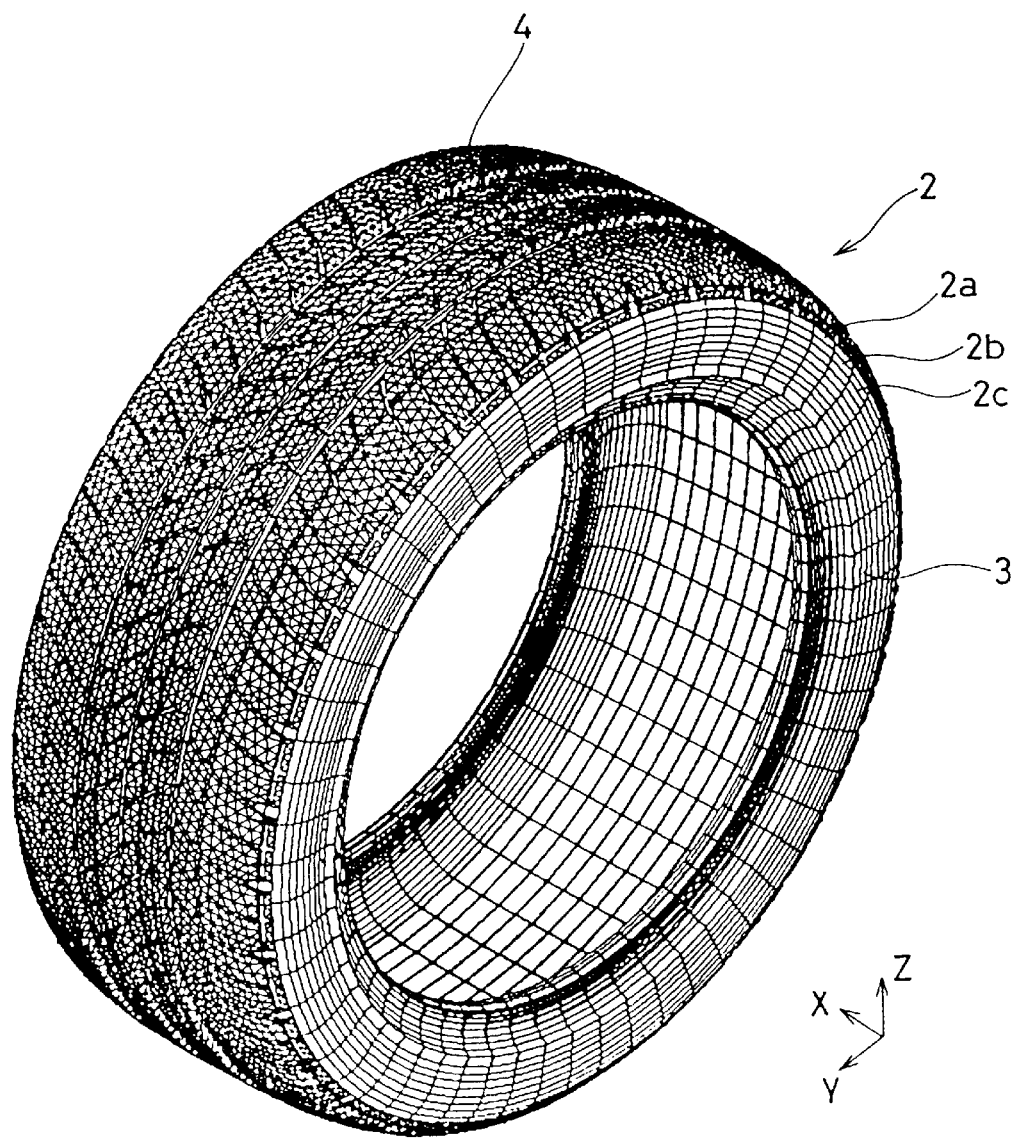
FIG. 2 is a simulator output showing a perspective view of a finite-element model of a pneumatic tire.
Figure 3:
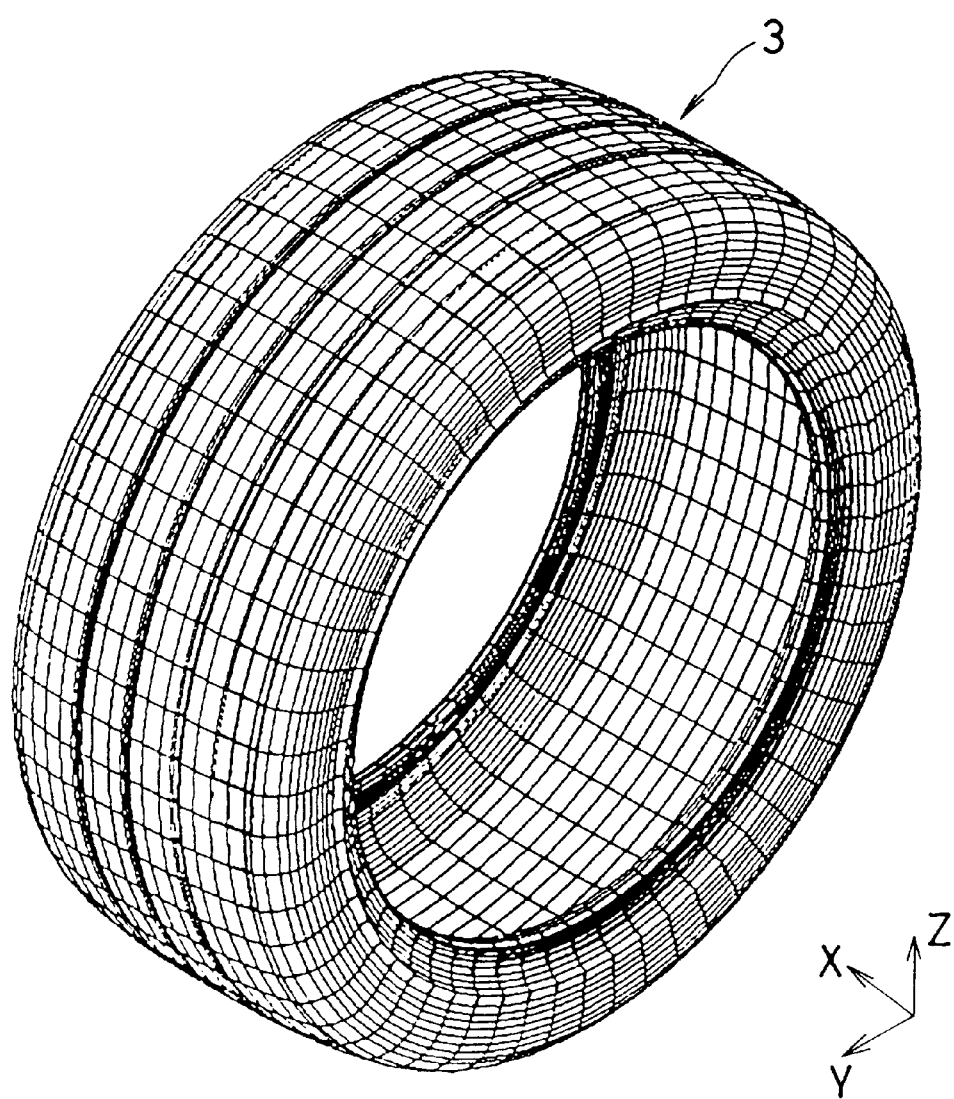
FIG. 3 is a simulator output showing a perspective view of a body model thereof.
Figure 4:
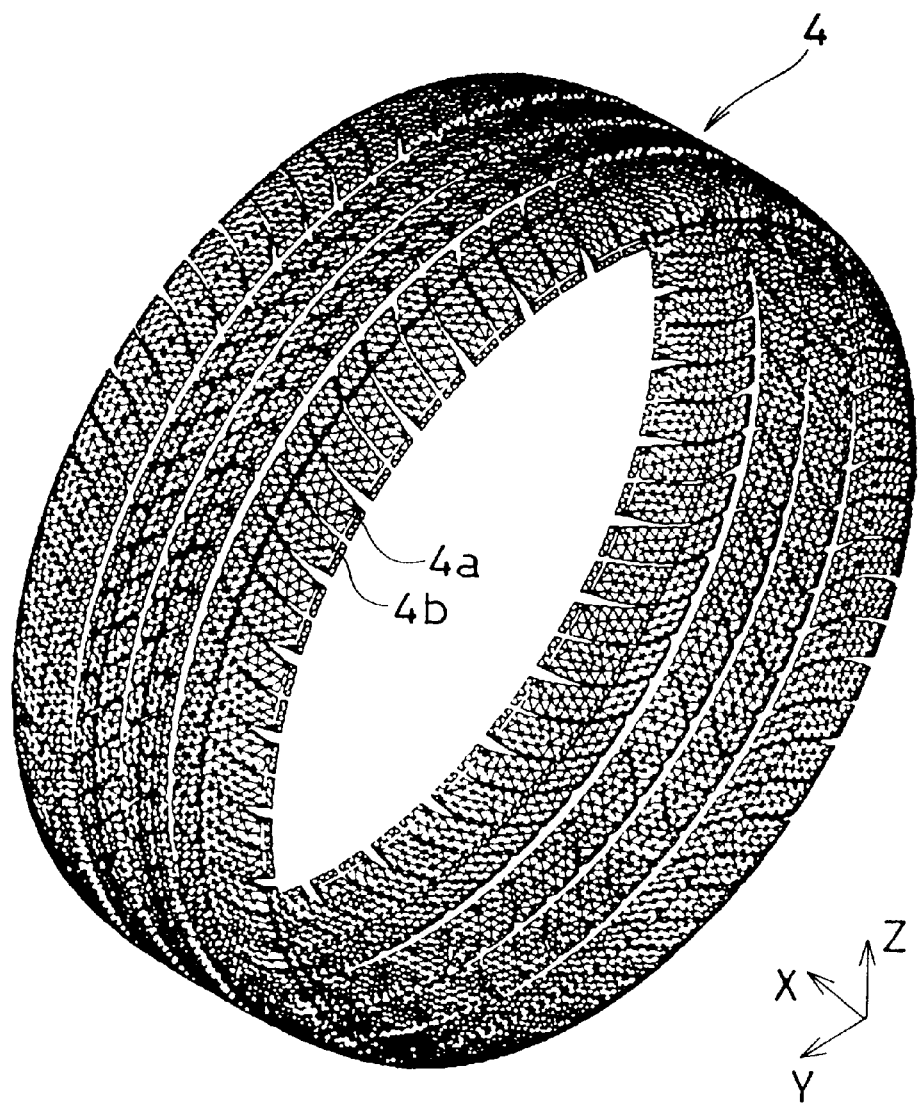
FIG. 4 is a simulator output showing a perspective view of a tread model thereof.

As shown in FIGS. 2, 3 and 4, a finite-element model 2 of the tire T is made up of a body model 3 and a tread model 4 which are separately modeled and then join with each other.

The body model 3 is defined as of a tire body 1B or an annular part of the tire which is materially and geometrically the same or constant along the tire circumferential direction.

The tread model 4 is therefore, defined as the remaining part (hereinafter tread part 1A) around the tire body 1B which varies along the tire circumferential direction either materially or geometrically at least.

As a result, it is possible to use relatively large-sized elements in the tire body model 3 in comparison with the tread model 4, whereby the computing time can be greatly saved without degrading the simulation.

Body model

Figure 13:
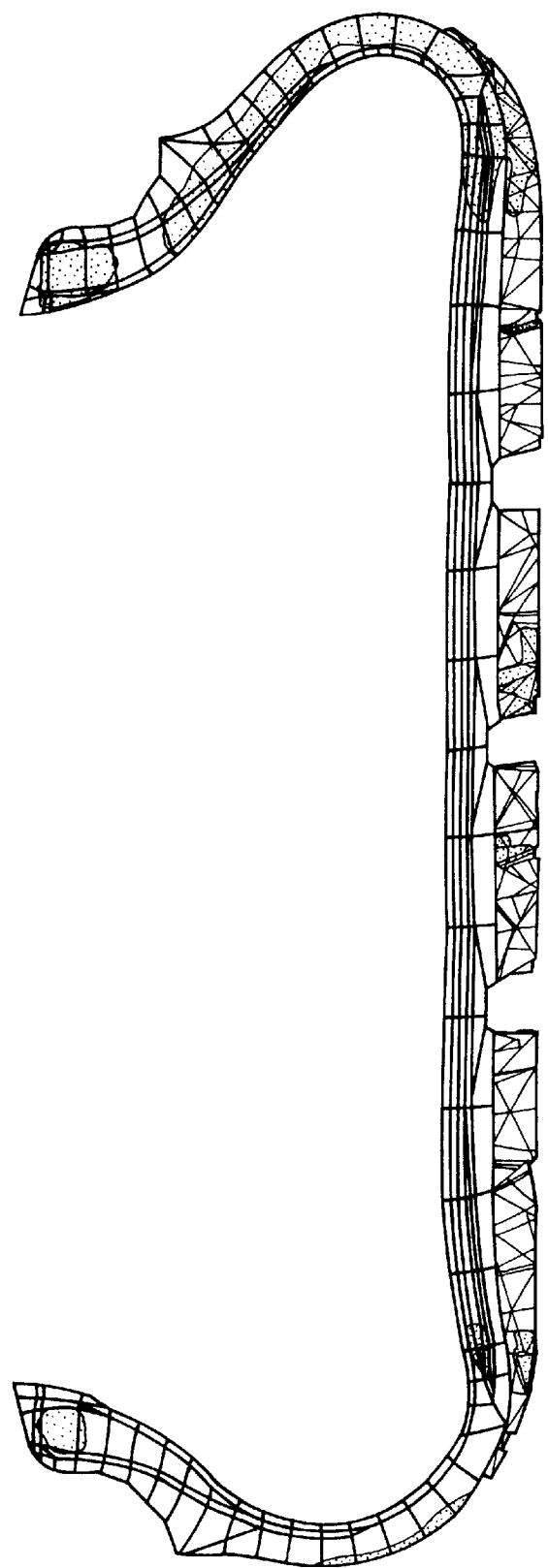
FIG. 13 is a simulator output showing the cross section of the tire model during cornering.

As shown in FIGS. 3 and 13, the tire body 1B is modeled by plural kinds of elements suitable for each individual part or member.

In case of the example tire T, the tire body model 3 is made up of rubber models of various rubbers such as the tread rubber, sidewall rubber, bead rubber and the like, and a bead core model, and cord ply models of various reinforcing cord plies such as the carcass ply, belt plies and the like.

Cord ply model

Figure 5:
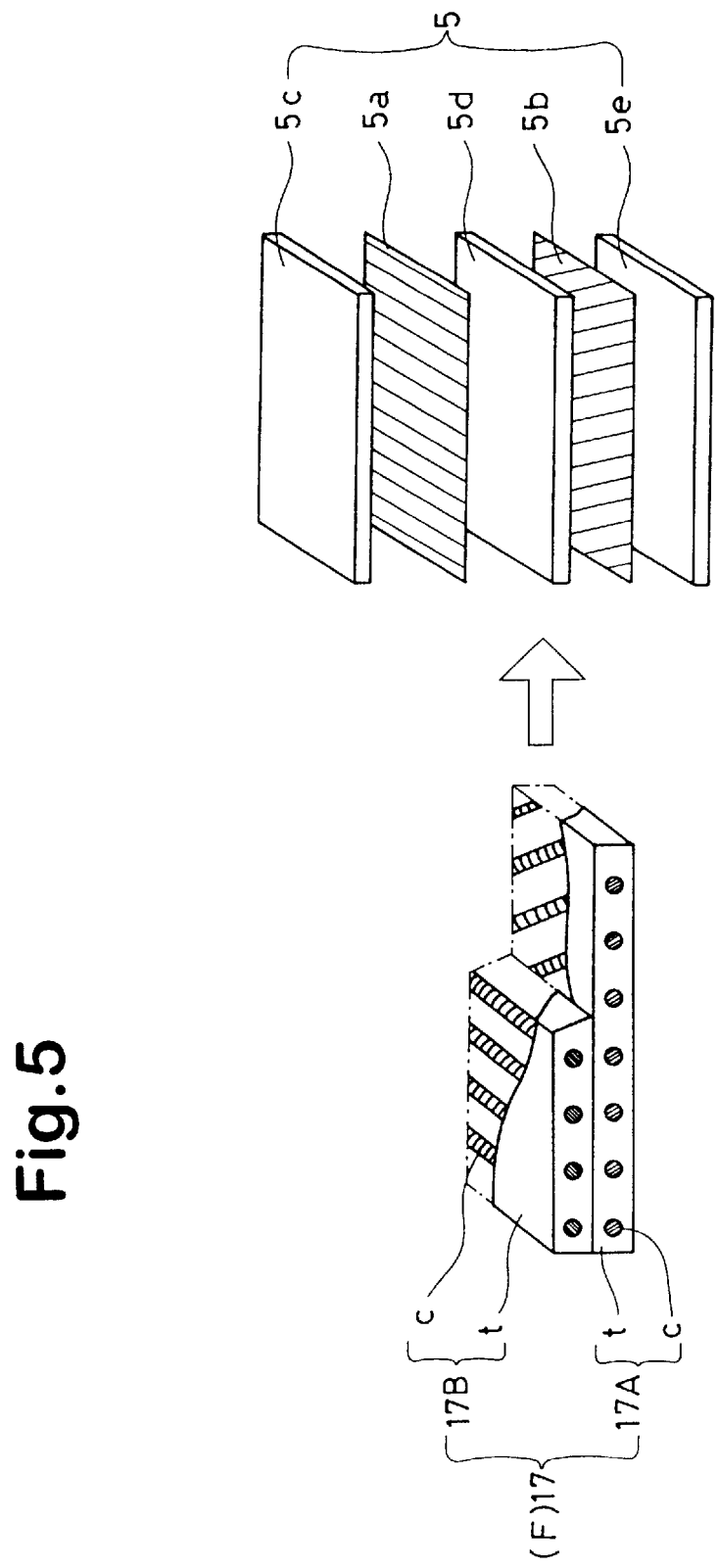
FIG. 5 is a diagram for explaining a model of a rubberized cord ply.

As shown in FIG. 5, an actual reinforcing cord ply is such that parallel cords (c) are rubberized with topping rubber (t). Therefore, a ply of cords (c) is modeled by quadrilateral membrane elements (5a, 5b), and a layer of topping rubber (t) is modeled by hexahedral solid elements (5c, 5d, 5e).

The quadrilateral membrane elements for such a cord ply are defined as an orthotropic material in which the rigidity in the cord longitudinal direction differs from the rigidity in the normal direction thereto and the rigidity in each direction is homogeneous, and the thickness thereof is the same as the cord diameter.

The hexahedral solid elements for such a topping rubber layer are defined as a homogeneous super-viscoelastic material.

Rubber model

The sidewall rubber 21, bead rubber 22, a part of the tread rubber (in this example, only the under-tread rubber 10a), and other rubber layers (if any) are modeled by a hexahedral solid element and/or a pentahedral solid element. As to the material definition, the elements are defined as a homogeneous viscoelastic material whose complex elastic modulus is the same as the actual rubber.

Bead core model

The bead core 14 is modeled by a hexahedral solid element and/or a pentahedral solid element. As to the material definition, the elements are defined as a relatively rigid material having an elastic modulus equal to the actual bead core.

Tread model

The tread model 4 is of a radially outmost part 1A of the tire which varies materially and/or geometrically in the circumferential direction as explained above. However, this does not intend to completely exclude a circumferentially homogeneous part. A circumferentially homogeneous part immediately inside the tread pattern may be included like a pedestal. For example, it may be possible to define the radially outmost part 1A as being the entire tread rubber outside the belt. In case of the example tire T, it is also possible to define the tread model 4 as of the tread cap rubber 20b, and accordingly the tire body 1B is the remaining part other than the tread cap rubber 20b.

In any way, the tread part 1A is modeled by tetrahedral solid elements (4a, 4b - - -) in full detail all around the tire as shown in FIG. 4. The tetrahedral solid elements are defined as a homogeneous viscoelastic material whose complex elastic modulus is the same as the actual rubber.

Because it is preferable to minimize such a circumferentially homogeneous part immediately inside the tread pattern, the tread model 4 is usually formed as of a mix of various shapes of rubber pieces such as blocks, ribs, lugs and the like.

Tire model

Figure 6:
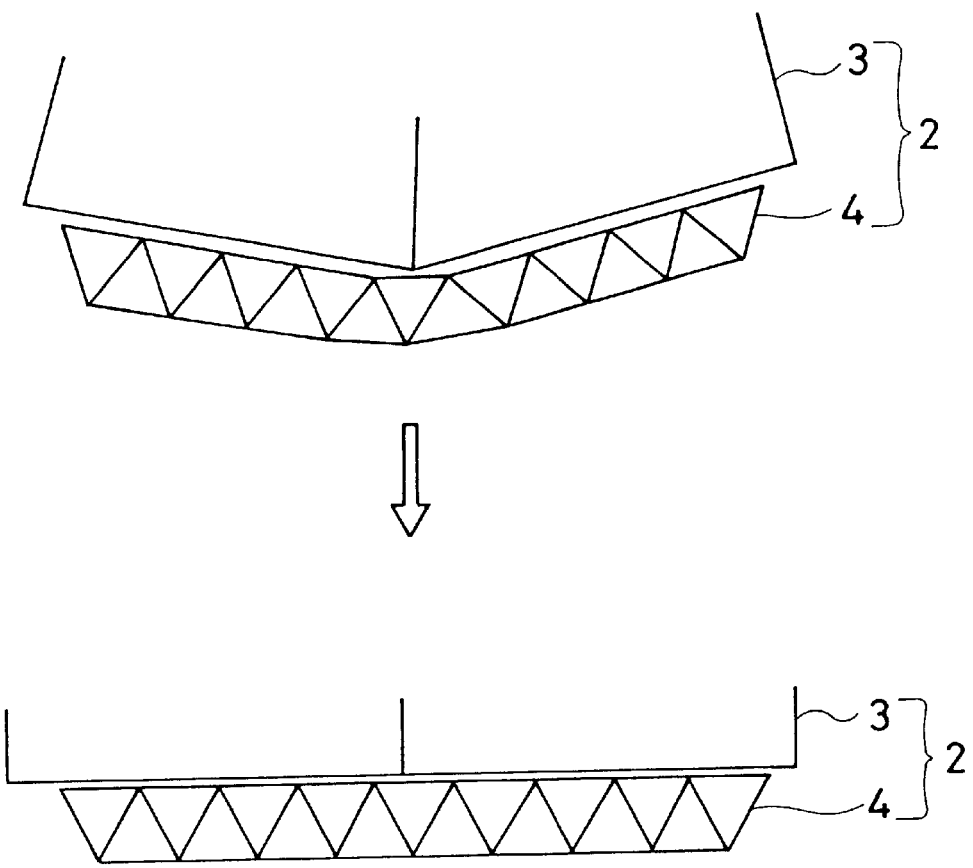
FIG. 6 is a diagram showing deformation of the elements along the boundary between the tire body model and tread model.

As explained above, the tread model 4 is formed separately from the body model 3. Then, to form a tire model 2, the tread model 4 is connected with the body model 3 by means of forced displacement such that the elements' faces and nodes on the radially inside of the tread model 4 do not change their relative positions to the elements' faces and nodes on the radially outside of the body model 3 anytime as shown in FIG. 6.

Road model

Figure 10:
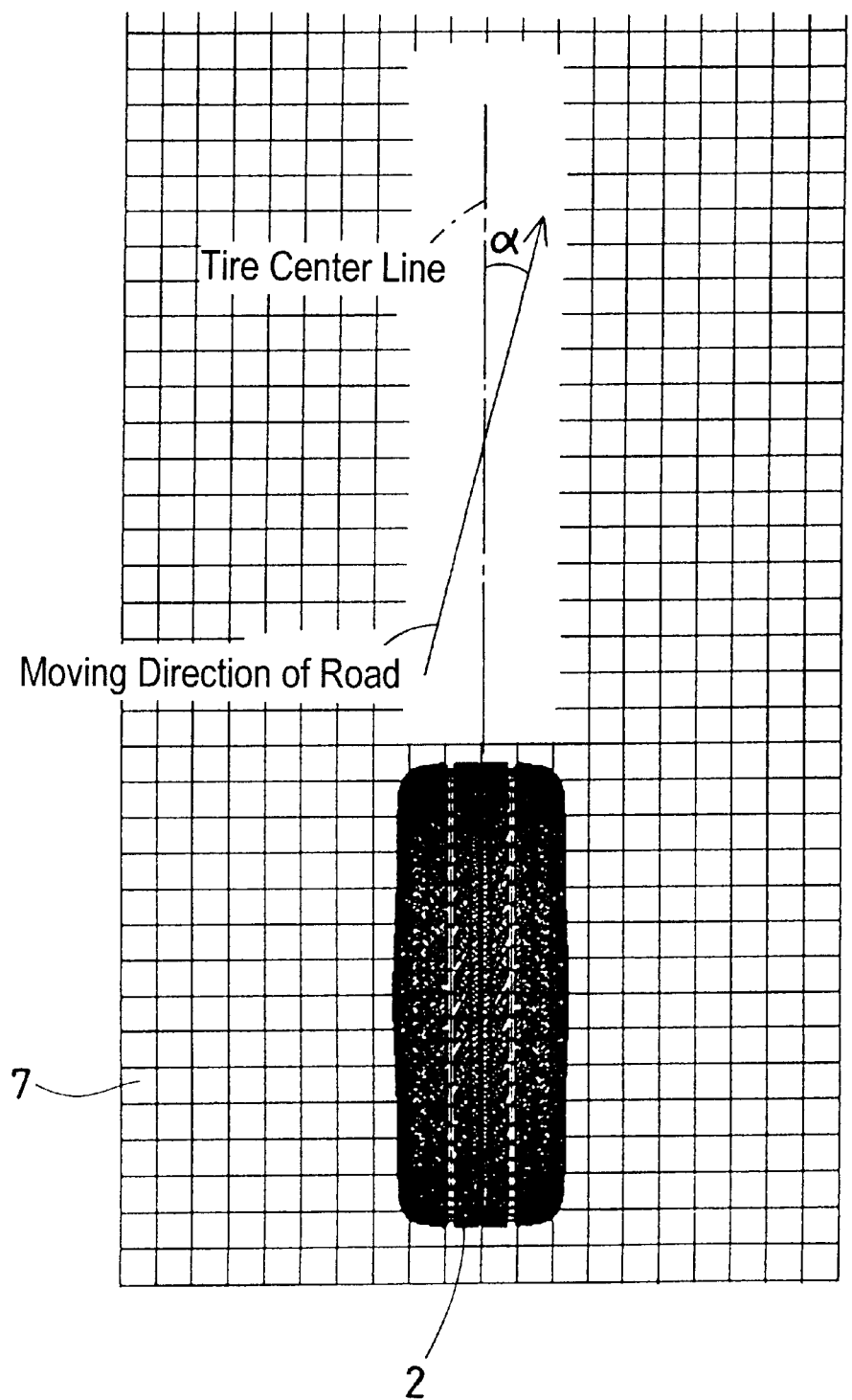
FIG. 10 is a simulator output showing the tire model during cornering.

FIG. 10 shows a model of an even road surface 7, wherein the road surface is modeled by quadrilateral (rectangle) rigid elements.

Figure 15A:
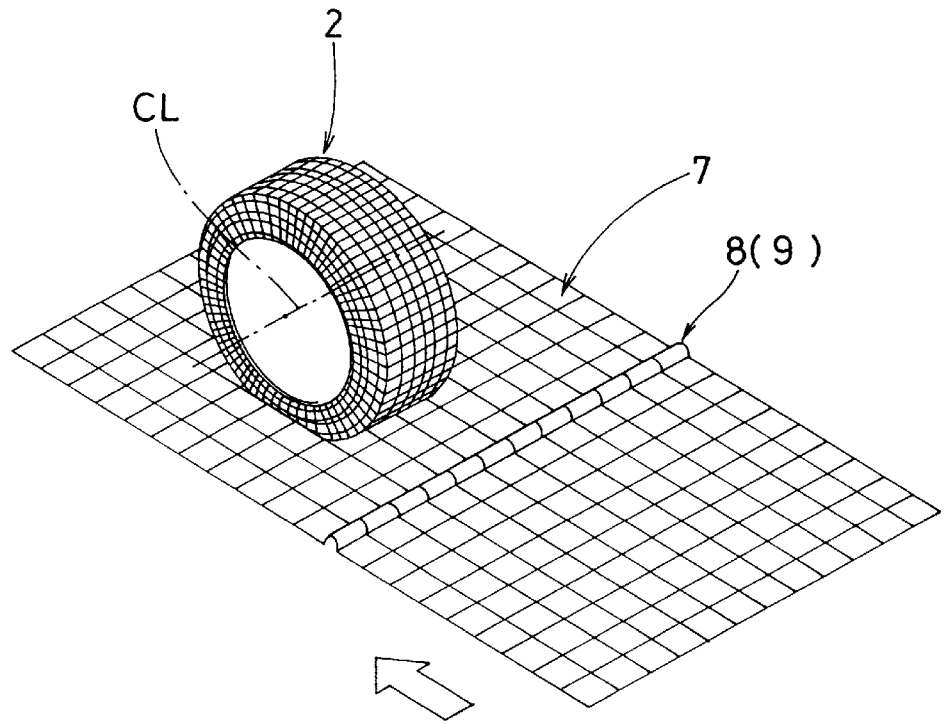
FIG. 15A is a simulator output showing a perspective view showing one scene of the tire model running on an uneven road surface.
Figure 15B:
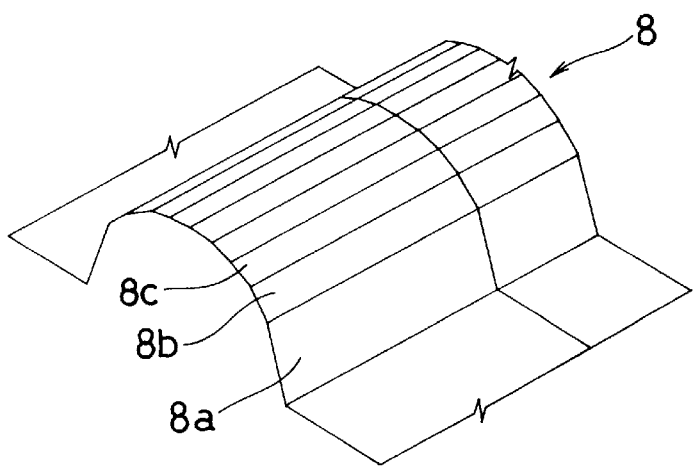
FIG. 15B is an enlarged view of a finite-element model of a protrusion on the uneven road.

FIGS. 15A and 15B show a model of a bumpy road surface, wherein the flat part 7 and the remaining part 8 are both modeled by quadrilateral rigid elements. In FIG. 15B, a protrusion 8 which is a half-columnar protrusion whose radius is 1 cm is modeled by quadrilateral rigid elements (8, 8a, 8b, 8c - - -).

By varying the friction coefficient of the simulated road surface, various conditions such as snowy road, icy road, sandy road, mudy road and the like can be simulated.

Simulator

Figure 7:
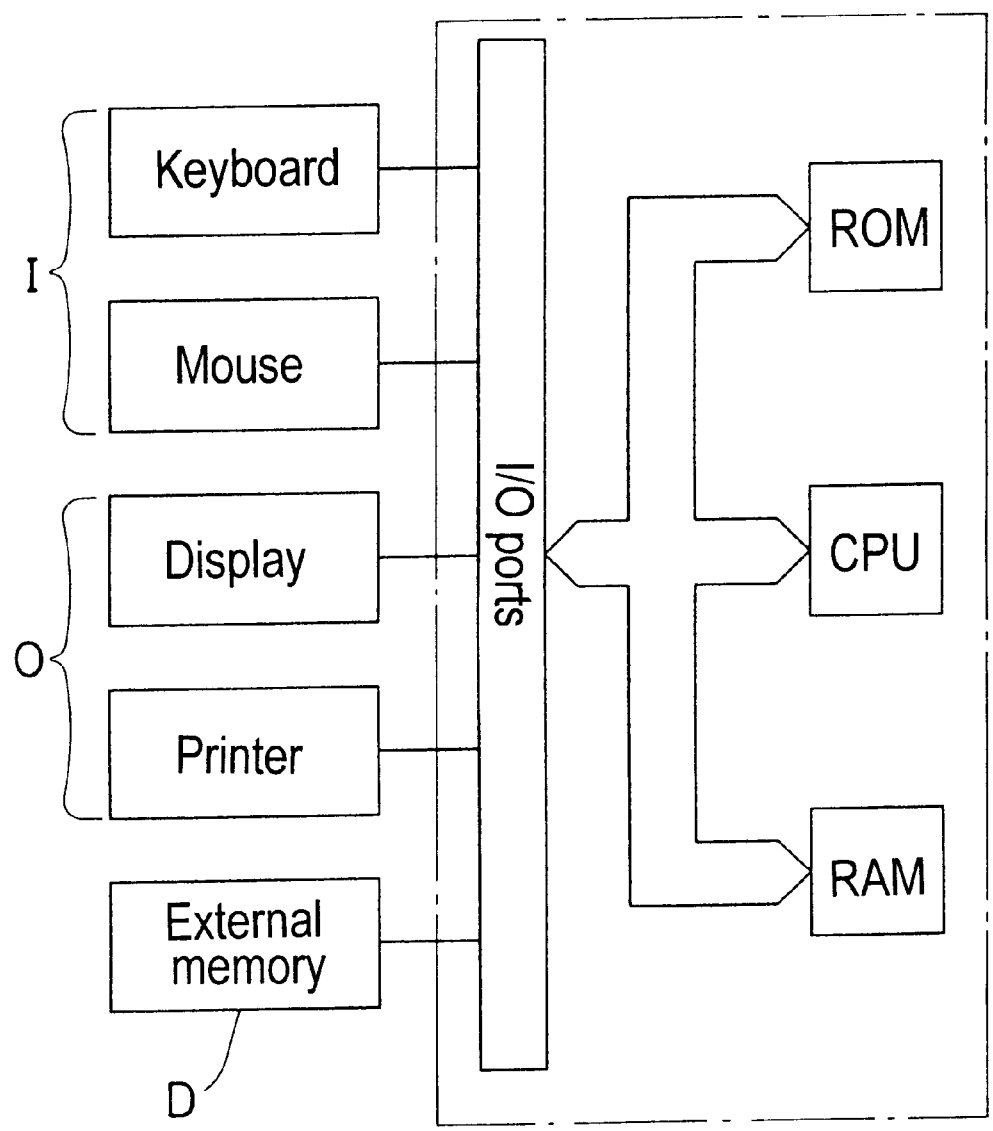
FIG. 7 is a block diagram for explaining a dynamic tire simulator according to the present invention.
Figure 8:
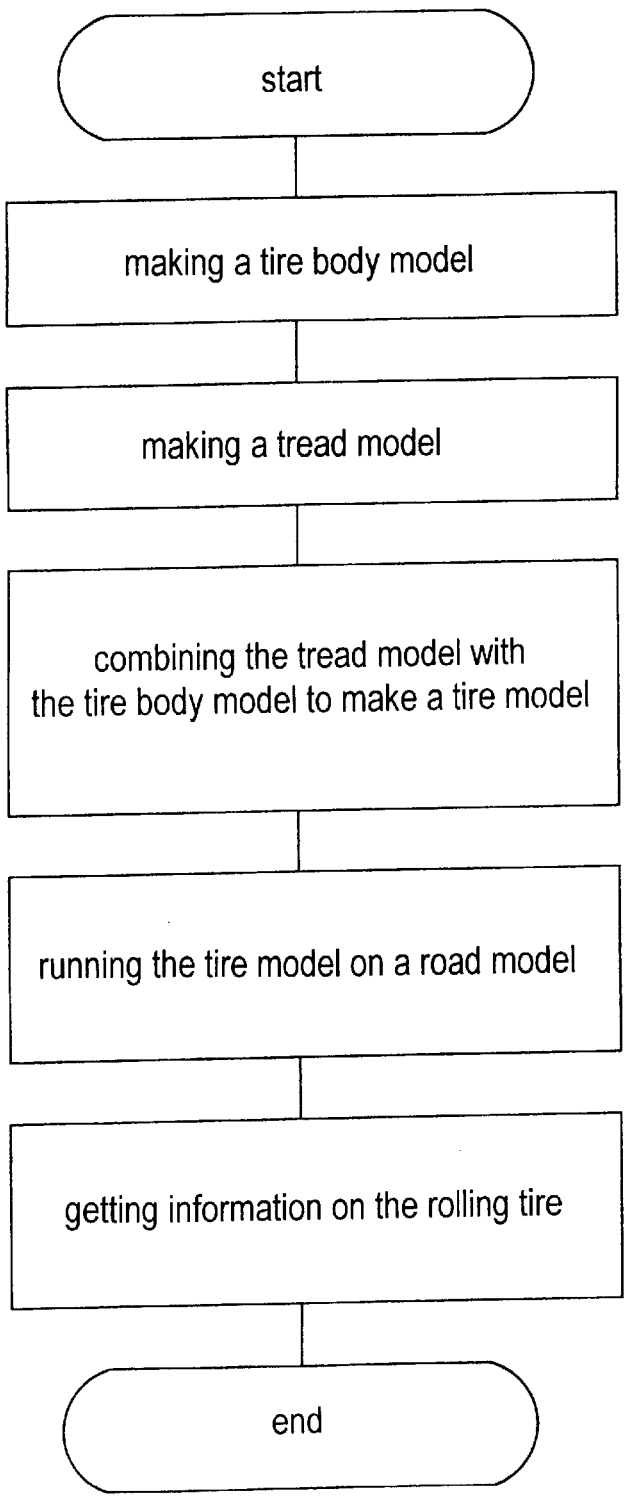
FIG. 8 is an example of the system flowchart of the simulator.

As shown in FIG. 7, the simulator according to the present invention includes a computer comprising a CPU, ROM, RAM, and I/O ports which are connected with data bus. Further, the simulator includes peripherals connected to the I/O ports, such as input devices (I), e.g. keyboard, mouse and the like, output devices (O), e.g. display and printer, external memory (D), e.g. hard disk, magneto-optic disk and the like. According to a program stored in the memory (D), the computer plays the following multiple functions. In FIG. 8, an example of the system flowchart is shown.

Making Body model

As explained above, the tire body 1B is defined as being uniform all around the tire axis. Therefore, the above-mentioned 3-D body model 3 is made by inputting two dimensional (2-D) data of the tire cross section, and spreading the inputted 2-D data in the circumferential direction.

In the simulator therefore, the contours of various parts, e.g. carcass plies, belt plies, bead cores, bead apex rubber, bead rubber, sidewall rubber, under tread rubber and the like are first inputted as 2-D data. The inputted 2-D data can be shown on the display monitor as a 2-D wire frame model for the purpose of confirmation and the like. It is possible to input the date by means of keyboard, mouse, scanner, digitizer and the like. Then, the 2-D frame model is spread around the tire axis to make a toroidal 3-D solid model, and at the same time, the solid model is divided into finite elements (tetrahedral elements, pentahedral elements and hexahedral elements, quadrilateral elements and the like) as explained above.

Making Tread model

As explained above, the tread part 1A is usually not uniform in the circumferential direction. On the other hand, a tread pattern is usually formed by repeating a design unit in the tire circumferential direction.

In the simulator, therefore, in order to save the data input, 3-D data of one design unit are inputted, and they are repeated in the circumferential direction to form a complete tread pattern.

To further simplify the input data, it is preferable to define the above-mentioned tread part 1A as being materially and geometrically the same or constant along the radial direction if possible. In this case, the simulator spreads radially of the tire 2-D data of the design unit at the tread face for example to form the 3-D model of the design unit which is to be circumferentially repeated.

In anyway, when a 3-D solid model of the tread part 1A is made, the simulator divides it into finite elements (tetrahedral elements) as explained above.

Up to this point, all geometrical data of the tire are inputted. Further, material data are inputted. When the body model, tread model and intervening models such as of one design unit are made, the data thereof are stored in a library prepared in a memory (D) for reuse.

The operator can select a body model and a tread model from the library, and in response to the operator's demand, the simulator joins the tread model 4 to the body model 3 to make a tire model 2.

Rim-mounting and Inflating simulation

Actual pneumatic tires must be mounted on a wheel rim and inflated with air. In the simulation, however, it is not necessary to model the wheel rim because it is regarded as an almost complete rigid body in comparison with the tire.

Figure 9:
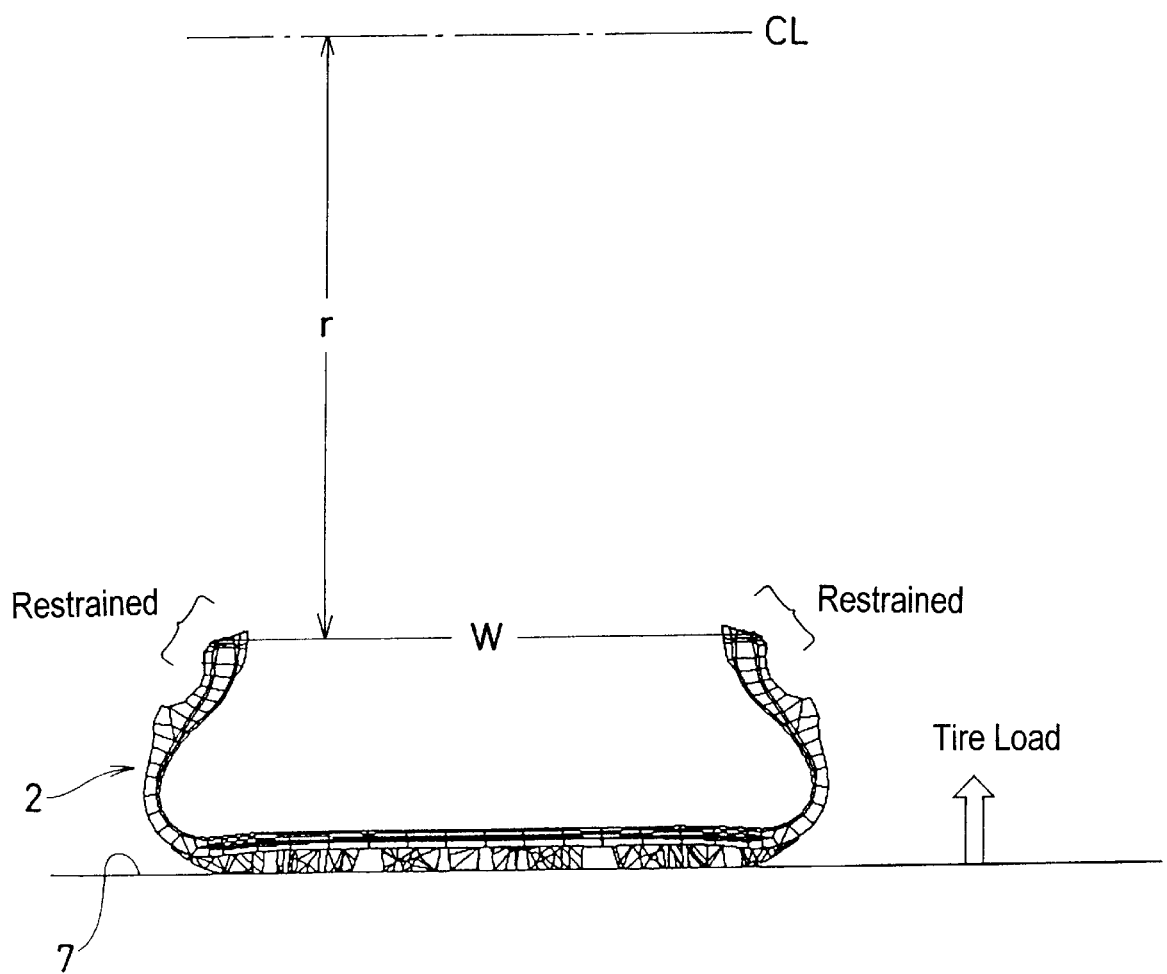
FIG. 9 is a simulator output showing a cross sectional view showing a loaded state of the tire model.

Therefore, to simulate the tire mounted on a wheel rim, as shown in FIG. 9, the axial distance W between the beads of the tire model 2 is set up to at a constant value equal to the rim width.—Usually the bead width W of a pneumatic tire not mounted on a wheel rim is larger than the rim width. Thus, by mounting the tire, the width W decreases. At the same time, a surface 10 of the beads which comes to contact with the wheel rim is restrained. In other words, the rim-contacting face 10 is maintained not to change the relative position with respect to the direction of the tire axis CL and the normal direction (r) to the tire axis or radial direction.

In the simulator, according to the tire size inputted, the simulator searches a tire-rim database stored in the memory (D) for an approved rim size. If not found, the simulator requests the operator to choose one rim from a list or to input new data of the wheel rim. Then, according to the rim data chosen or inputted, the simulator computes the rim-contacting surface 10, and restrain the surface 10 not to change axially and radially their coordinates relative to the tire axis. However, to simulate the rotation, the motion in the circumferential direction is allowed.

Thus, the tire model can simulate its state mounted on a wheel rim.

Further, to simulate the inflation of the tire, the simulator applies a load or strain of a constant value corresponding to the inner pressure of the tire to the inner surface of the tire model 2.

Making Road model

The simulator makes a road model using quadrilateral rigid elements according to the inputted road surface data. As to the road surface data, the friction coefficient of the road surface must be inputted together with conditions of the road surface, for example, whether smooth or bumpy, the shape, size and number of protrusion(s) and/or hollow(s) if bumpy, an angle of inclination and so on.

Dynamic Simulation of Rolling Tire

To simulate a pneumatic tire rolling on a road, the tire model is caused to contact with a road model and a tire load is applied thereto. Then, the road surface is moved relative to the tire in predetermined conditions if the tire is on an idler wheel. If the tire is on a drive wheel, the tire is rotated. As the running condition data, whether straight running or cornering, i.e. slip angle, and the running speed, camber angle, tire load, air pressure and the like are inputted. According to the inputted data, the simulator makes the above-mentioned matrixes and kinetic equation and computes the equation to find solutions at the predetermined time intervals. These solutions are once stored in the hard disk memory (D), and in response to the operator's demand, the simulator outputs these to the display as an animation or to the printer as still pictures.

Cornering simulation

Figure 14:
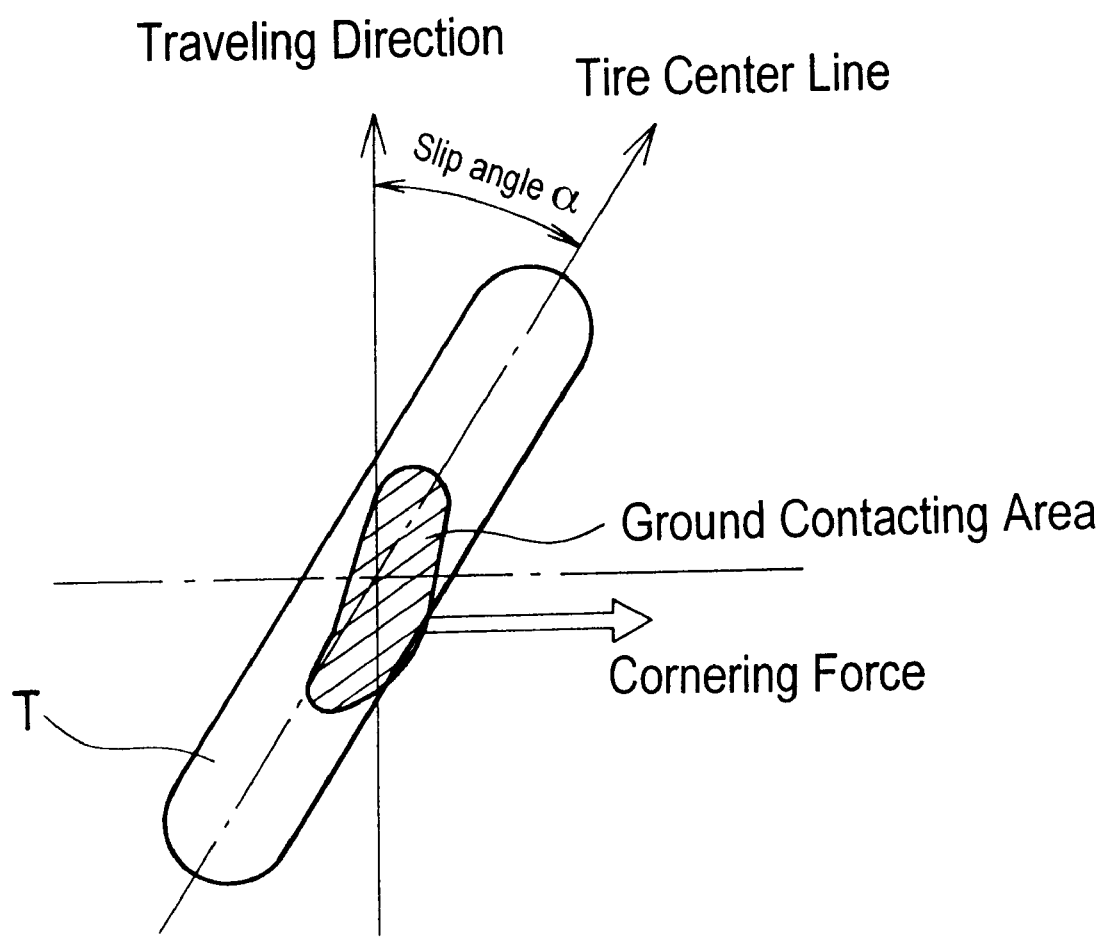
FIG. 14 is a diagram for explaining a cornering force.

To simulate a tire during cornering, the road surface is moved relatively to the tire in a direction at a certain angle α with respect to the longitudinal direction of the tire as shown in FIG. 10, wherein the angle α corresponds to the slip angle of the tire shown in FIG. 14. FIG. 10 is a copy of the display monitor showing a cornering simulation. As shown in FIG. 14, during cornering, a ground contacting part of the tread is moved sideways as the tire rotates while contacting with the road surface. Accordingly, the tread rubber undergoes a sharing deformation thereby causing a force at a right angle to the traveling direction, namely cornering force.

In the cornering simulation, the simulator computes and outputs the cornering force and ground pressure distribution and the internal stress distribution of the tire.

Figure 11:
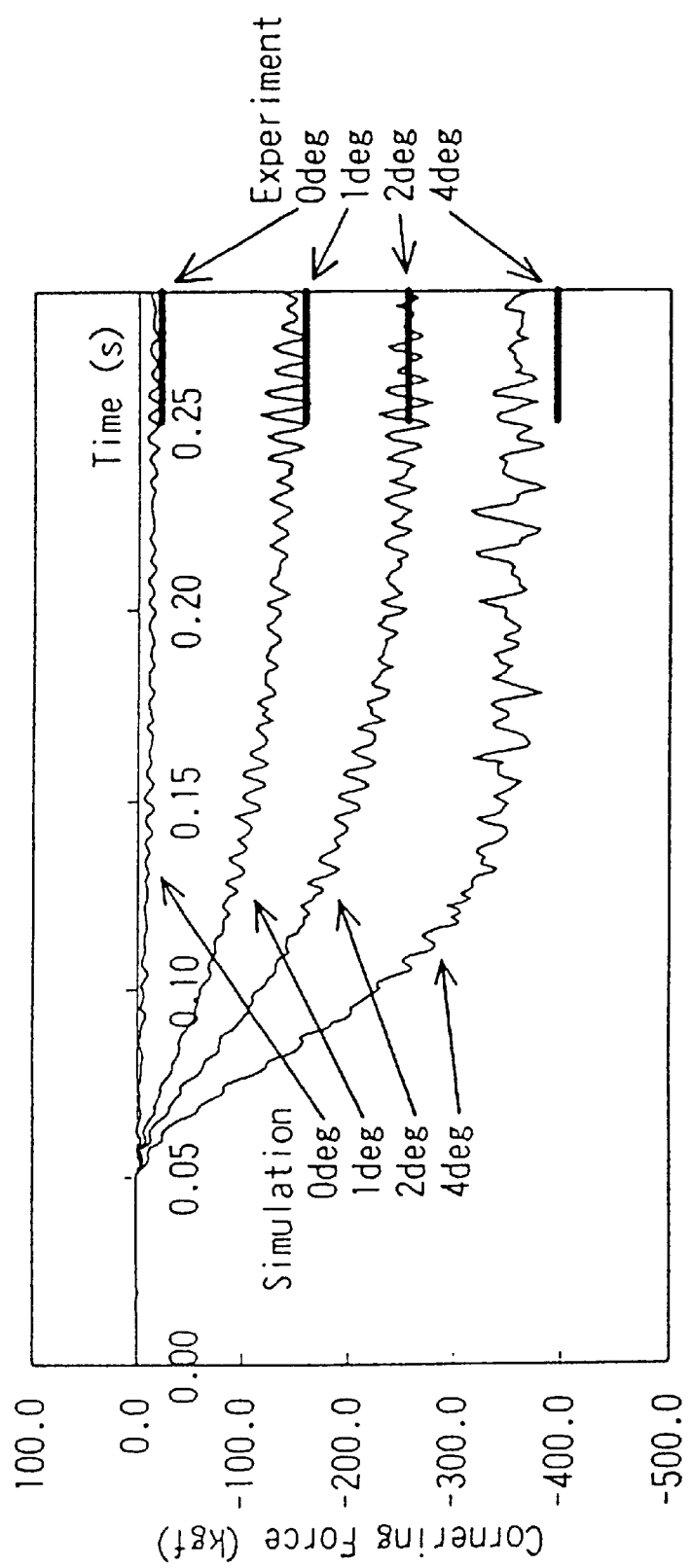
FIG. 11 is a simulator output showing variations of initial cornering force computed.

FIG. 11 is a simulator output showing the cornering force obtained from a cornering simulation as a function of the lapse time from the start. In this simulation, the road surface was defined as a flat and rigid surface and modeled as explained above. The tire model inflated to a normal pressure, and the road surface model was pressed on the tread by a standard tire load. The tire model was rotatable around the axis, and was rotated by the frictional force of the moving road surface. Both the static and dynamic friction coefficients were 1.0. The moving speed was 20 km/h. The cornering force from the simulation well corresponds to experimental results of a tire drum test on which results are also shown on the right-hand side of FIG. 11.

From the simulation, it was discovered that the cornering force becomes a stationary state after 0.15 to 0.20 sec. which corresponding to about one half rotation of the tire. Accordingly, it is almost impossible to estimate the cornering force without the dynamic simulation in which the tire model is rotated at least one half revolution.

Further, this simulation was carried out at the slip angle α of zero degree. Thus, it was a straight running simulation. However, a small cornering force was observed as shown in FIG. 11, which is supposed to be ply steer of the belt plies. This shows that the simulation is a true simulation.

Figure 12:
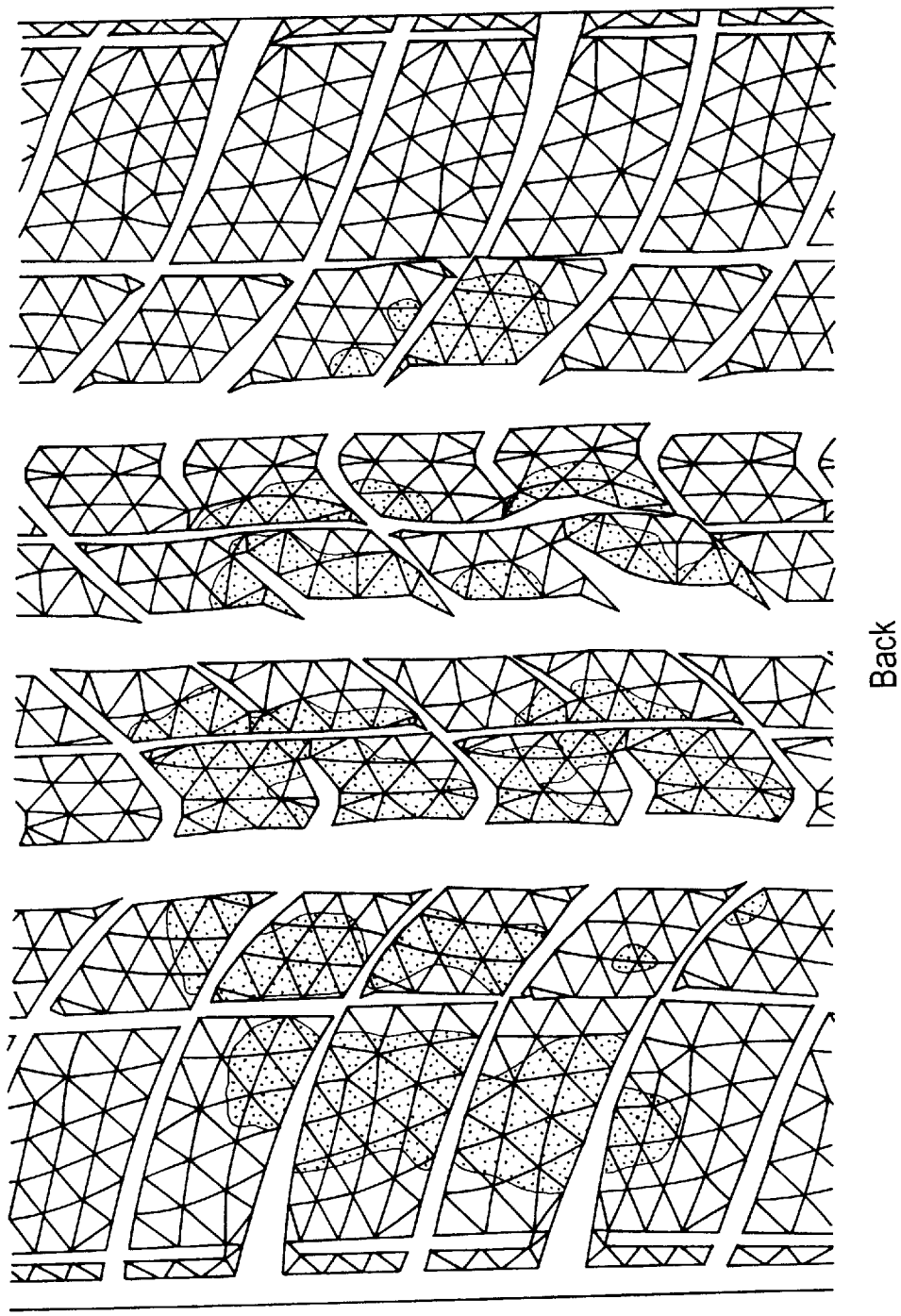
FIG. 12 is a simulator output showing a ground pressure distribution during cornering.

FIG. 12 is a simulator output showing the ground pressure distribution during cornering at the slip angle of 4 degrees. In FIG. 12, only the highest pressure regions are shaded with fine dots, but in the actual output, the distribution is indicated by changing color.

FIG. 13 is a simulator output showing the cross section of the tire in the circumferential center of the ground contacting patch during cornering at the slip angle of 4 degrees. In FIG. 13, the highest stress regions are shaded with fine dots, but in the actual output, the stress distribution is indicated by changing color. FIG. 13 shows that the simulator can reproduce a state in which a large tensile stress is occurring in the inside tire sidewall (right-hand side of FIG. 13).

Tread Wear Estimation

It can be said that the amount of wear is proportional to wear energy. The wear energy at a specific point is obtained by integrating the product of the ground pressure and slippage at the point from touching to the road surface to detaching therefrom.

In this invention, therefore, with regard to every node of the elements in the ground contacting region, a wear energy in X-axis direction (tire axial direction) is calculated by integrating the product of the sharing force and slippage in X-axis direction and also a wear energy in Y-axis direction (tire circumferential direction) is calculated by integrating the product of the sharing force and slippage in Y-axis direction. Then these are added up as the overall wear energy at the node.

The simulator makes such calculations during making a running simulation. When the calculations are finished, the simulator stores the results in the memory (D), and then in response to an operator's demand, the simulator outputs the results to the display monitor or the printer.

Figure 18:
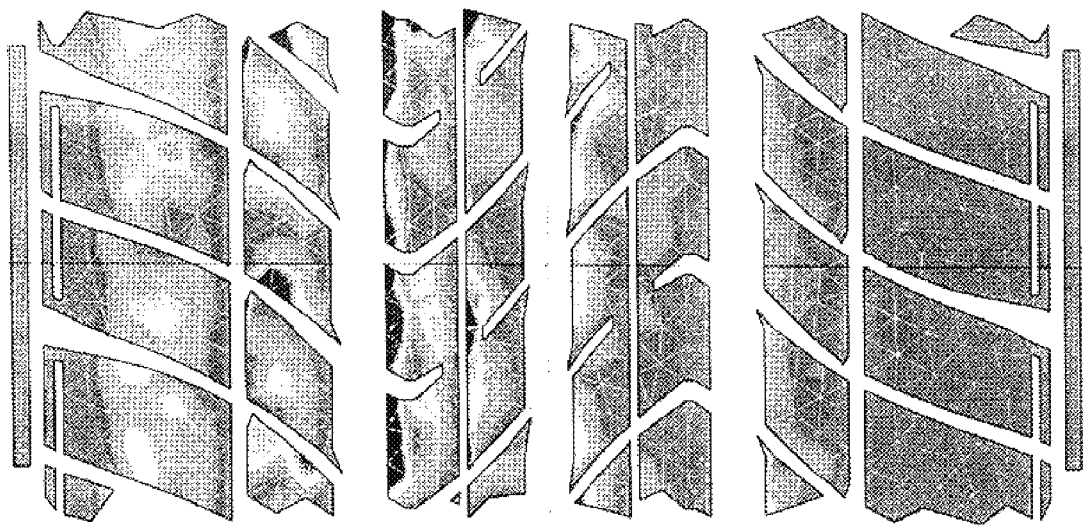
FIG. 18 is a simulator output showing a distribution of tread wear energy obtained during the cornering simulation.

FIG. 18 shows such an output, wherein the wear energy distribution is indicated on the tread model 4 by changing color although the color becomes a monotone in FIG. 18. This output example was obtained during the above-mentioned cornering simulation. Of course, it is possible to compute the wear energy under various conditions including straight running.

Figure 19:
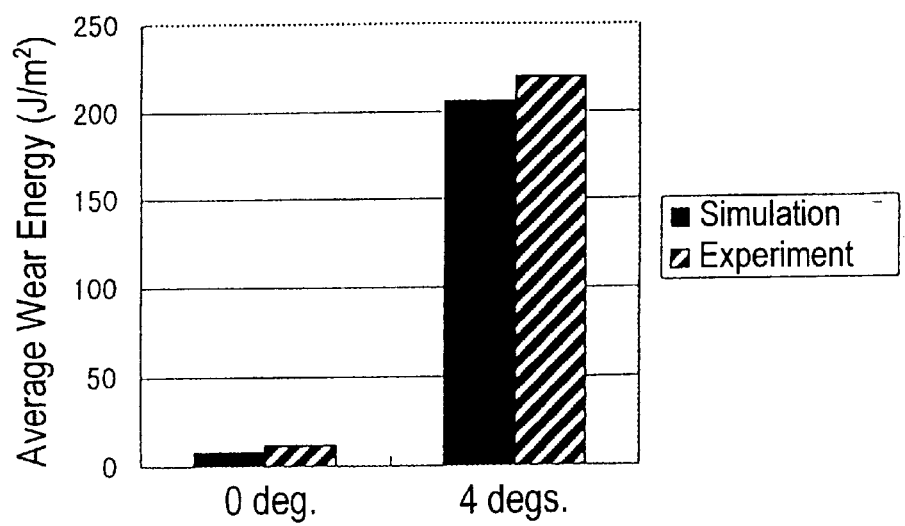
FIG. 19 is a graph showing the wear energy obtained by simulation and experiments.

FIG. 19 shows the wear energy obtained by the simulation and that by experiments. This shows that the method and simulator of the present invention well simulate the actual running conditions, and that the tread wear estimation is reliable.

In this invention, it is also possible to compute such overall wear energy for a specific small area, for example, only one block or rib.

Damping Simulation (Vibrational Characteristic Estimation)

In a damping simulation, road data of a bumpy road are inputted to the simulator to make a bumpy road model. The tire model 2 was mounted on a wheel rim and inflated to a pressure as explained above, and the tire model 2 was placed on the road model and loaded by applying a standard load to the tire axis CL. Then the road surface 7 was moved at a predetermined speed (60 km/h) to rotate the tire by the frictional force between them. The dynamic and static friction coefficients were 1.0 in the following test simulation.

The simulator computes the reaction force to the tire axis in the vertical direction and traveling direction in sequence of running time. The results are once stored in the memory (D), and then in response to an operator's demand, the simulator outputs the results to the display monitor or the printer.

FIG. 15A is a copy of one scene of the animated running simulation in which a protrusion 8 traverses the traveling course. The modeling of such a road is carried out automatically by the apparatus based on the inputted data as explained above.

Figure 16:
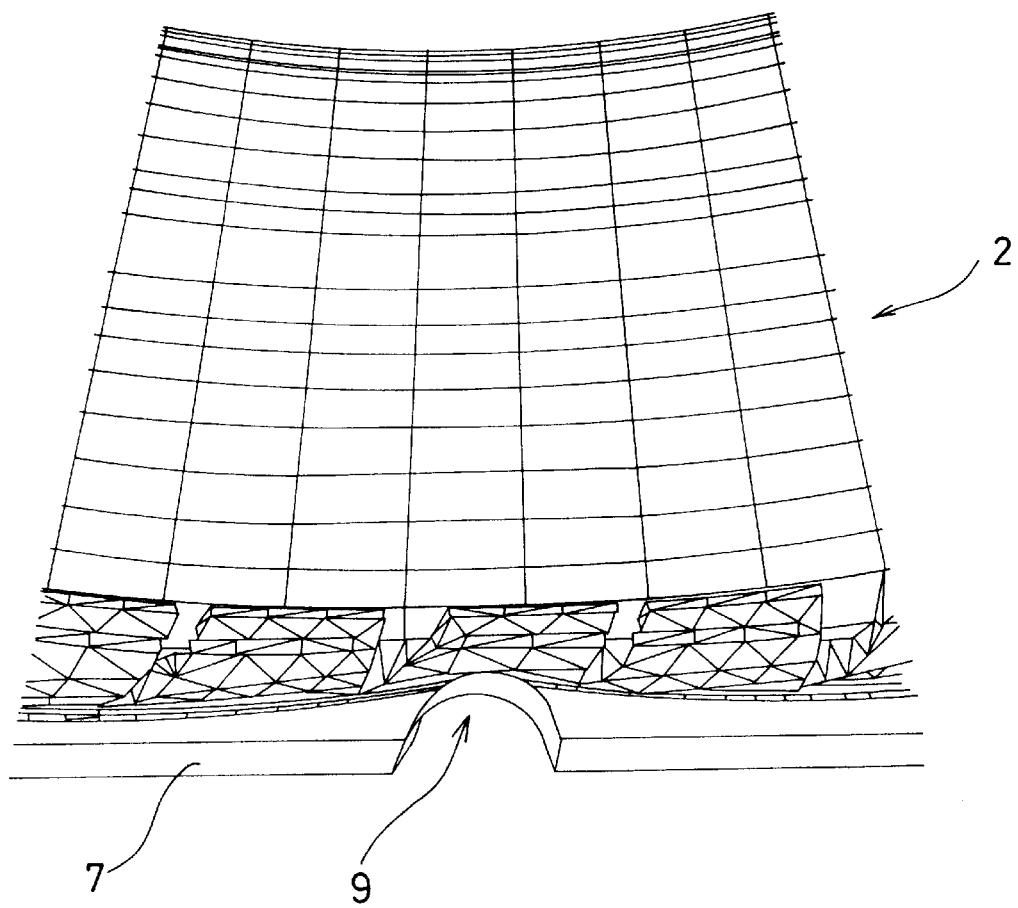
FIG. 16 is a simulator output showing a side view of the tire model just getting over the protrusion.

FIG. 16 is also a copy of one scene which shows the tire model just running over the protrusion. In the actual output, the stress distribution obtained by computing the stress at every node is also shown by changing color.

Figure 17:
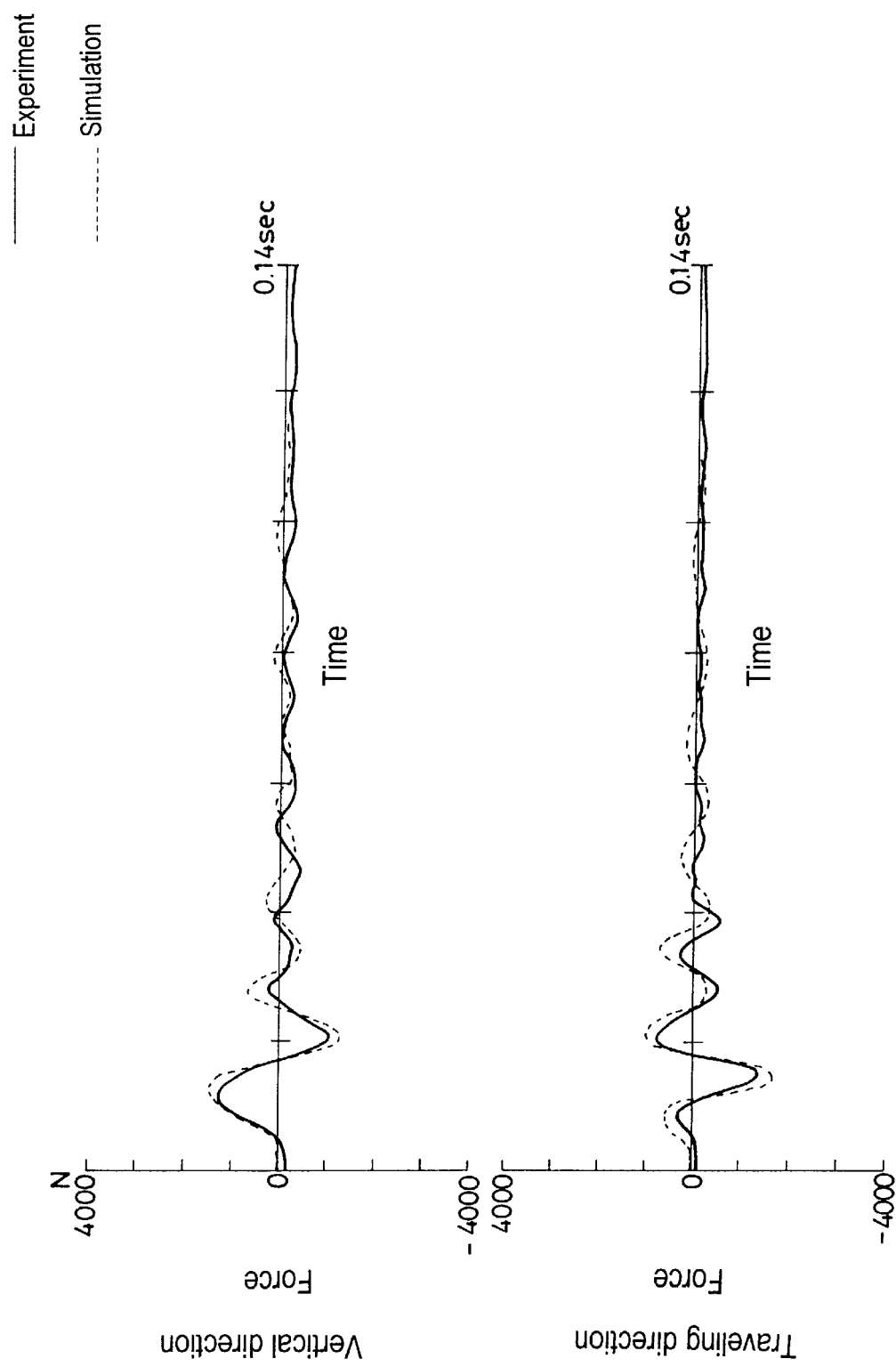
FIG. 17 is a simulator output showing damping characteristics (reactive forces when getting over the protrusion)

FIG. 17 is a simulator output (graph) in which the above-mentioned reaction force in two directions are shown in time sequence. Thus, the vibration characteristics such as damping factor are quite obvious therefrom. In FIG. 17, experimental results are also shown in broken line, from which it is known that the method and simulator of the present invention well simulate the actual running conditions on bumpy roads and that the estimate of the damping characteristic is reliable.

Foot print

As explained above, the simulator can compute the ground pressure distribution under various running conditions, and the data thereof is stored. Using those data, the simulator can output only a part of the tread of which ground pressure is positive, as the foot print during running.

The tire model which was used in the above-mentioned test simulations and is shown in FIG. 2 has 76359 elements and 43896 nodes. The modeled tire is a 235/45ZR17LM602 passenger car tire of Sumitomo Rubber Ind., Ltd.

As explained above, in the present invention, it is possible to make accurate simulations of a rolling tire under various conditions and also reliable estimations of the tire characteristics and performances. Further, it may be possible to estimate or analyze wet performances such as aquaplaning performance by coupling with fluid.

What is claimed is:

1. A method of simulating a pneumatic tire rolling on a road, said pneumatic tire comprising a carcass extending between beads, a bead core disposed in each of the beads, a belt disposed radially outside the carcass, a tread rubber radially outside the belt, sidewall rubbers axially outside the carcass, and bead rubbers in the beads, the method comprising the steps of dividing the tire into a tire body and a tread part therearound, wherein the tire body is defined as a toroidal part of the tire which is materially and geometrically the same or constant along the tire circumferential direction, and comprises the bead cores, rubber parts including the sidewall rubbers and bead rubbers, and cord reinforcements including the carcass and the belt, and the tread part is defined as the remaining annular part around the tire body which comprises at least a radially outmost part of the tread rubber, modeling the tire body in finite elements to make a body model, modeling the tread part in finite elements to make a tread model, making a finite-element model of the tire by combining the tread model with the body model, modeling the surface of the road in finite elements to make a road model, adjusting the beads of the tire model to a wheel rim on which the tire is mounted, contacting the tire model with the road model, moving the road model at predetermined intervals relatively to the tire model, giving running conditions including a moving speed, a slip angle, a tire load and a tire inflation pressure, obtaining information about the tire model at said predetermined intervals as numerical data in time sequence, and processing said numerical data in time sequence to be outputted as a visible information.

2. The method according to claim 1, characterized in that said body model comprises models of the bead cores, models of the rubber parts, and models of the cord reinforcements each comprising a model of a cord ply and a model of topping rubber, wherein the cord ply is modeled in quadrilateral membrane elements defined as an orthotropic material, and the topping rubber is modeled in hexahedral solid elements.

3. The method according to claim 2, characterized in that said information is at least one of a cornering force during cornering, a ground pressure distribution, a ground contacting area, an internal stress distribution, a reaction force from the road during running, a vibration damping factor, and a wear energy caused by slippage during running.

4. The method according to claim 2, characterized in that said running conditions further include at least one of a friction coefficient between the tire and road, a camber angle of the tire, and the number, shape and sizes of protrusion(s) and/or hollow(s) on the road.

5. The method according to claim 2, characterized in that said tire is provided in the tread with grooves having a maximum depth, and said tread part is a radially outmost part between the tread surface and a radially inner position corresponding to the maximum depth.

6. The method according to claim 1, characterized in that said information is at least one of a cornering force during cornering, a ground pressure distribution, a ground contacting area, an internal stress distribution, a reaction force from the road during running, a vibration damping factor, and a wear energy caused by slippage during running.

7. The method according to claim 6, characterized in that said running conditions further include at least one of a friction coefficient between the tire and road, a camber angle of the tire, and the number, shape and sizes of protrusion(s) and/or hollow(s) on the road.

8. The method according to claim 6, characterized in that said tire is provided in the tread with grooves having a maximum depth, and said tread part is a radially outmost part between the tread surface and a radially inner position corresponding to the maximum depth.

9. The method according to claim 1, characterized in that said running conditions further include at least one of a friction coefficient between the tire and road, a camber angle of the tire, and the number, shape and sizes of protrusion(s) and/or hollow(s) on the road.

10. The method according to claim 9, characterized in that said tire is provided in the tread with grooves having a maximum depth, and said tread part is a radially outmost part between the tread surface and a radially inner position corresponding to the maximum depth.

11. The method according to claim 1, characterized in that said tire is provided in the tread with grooves having a maximum depth, and said tread part is a radially outmost part between the tread surface and a radially inner position corresponding to the maximum depth.

12. An apparatus for simulating a pneumatic tire rolling on a road, which comprises means of performing the steps as set forth in claim 1.

* * * * *